United States Patent
Kitabatake (10) Patent No.: US 7,751,215 B2
(45) Date of Patent: Jul. 6, 2010

(54) SEMICONDUCTOR DEVICE AND ELECTRIC APPARATUS HAVING A SEMICONDUCTOR LAYER DIVIDED INTO A PLURALITY OF SQUARE SUBREGIONS

(75) Inventor: Makoto Kitabatake, Nara (JP)

(73) Assignee: Panasonic Corporation, Osaka (JP)

( * ) Notice: Subject to any disclaimer, the term of this patent is extended or adjusted under 35 U.S.C. 154(b) by 285 days.

(21) Appl. No.: 11/995,072

(22) PCT Filed: Jul. 7, 2006

(86) PCT No.: PCT/JP2006/313575

§ 371 (c)(1),
(2), (4) Date: Jan. 8, 2008

(87) PCT Pub. No.: WO2007/007670

PCT Pub. Date: Jan. 18, 2007

(65) Prior Publication Data

US 2009/0225578 A1 Sep. 10, 2009

(30) Foreign Application Priority Data

Jul. 8, 2005 (JP) ............... 2005-200517

(51) Int. Cl.
*H02M 7/537* (2006.01)
*H02M 7/5387* (2007.01)
(52) U.S. Cl. ................... 363/131; 363/147
(58) Field of Classification Search ........ 363/131, 363/147
See application file for complete search history.

(56) References Cited

U.S. PATENT DOCUMENTS 4,789,882 A * 12/1988 Lidow .............. 257/328
(Continued)

FOREIGN PATENT DOCUMENTS

EP 0 899 791 A2 3/1999
(Continued)

OTHER PUBLICATIONS

U.S. Appl. No. 11/996,855, filed Jan. 25, 2008.
(Continued)

*Primary Examiner*—Bao Q Vu
(74) *Attorney, Agent, or Firm*—McDermott Will & Emery LLP (57) ABSTRACT

The present invention provides a semiconductor device and an electric apparatus each of which can realize both high-speed switching operation and energy loss reduction and excels in resistance to current concentration based on a counter electromotive voltage generated by, for example, an inductance load of the electric apparatus. A semiconductor device (100) of the present invention includes: a semiconductor layer (3) made of a first conductivity type wide band-gap semiconductor; a transistor cell (101T) in which a vertical field effect transistor (102) is formed, the vertical field effect transistor (102) causing a charge carrier to move in a thickness direction of the semiconductor layer (3); and a diode cell (101S) in which a Schottky diode (103) is formed, the Schottky diode (103) being formed such that a Schottky electrode (9) forms a Schottky junction with the semiconductor layer (3), wherein the semiconductor layer 3 is divided into a plurality of square subregions (101T and 101S) based on virtual border lines (30) in plan view, and includes the subregion (101T) as the transistor cell and the subregion (101S) as the diode cell.

10 Claims, 4 Drawing Sheets

U.S. PATENT DOCUMENTS

| | | | | |
|---|---|---|---|---|
| 4,823,172 | A | * | 4/1989 | Mihara ............ 257/144 |
| 5,086,324 | A | | 2/1992 | Hagino |
| 5,111,253 | A | | 5/1992 | Korman et al. |
| 5,253,156 | A | | 10/1993 | Sakurai et al. |
| 5,886,383 | A | * | 3/1999 | Kinzer ............ 257/341 |
| 5,915,179 | A | | 6/1999 | Etou et al. |
| 6,476,456 | B1 | | 11/2002 | Boden, Jr. |
| 2002/0047124 | A1 | | 4/2002 | Kitabatake |
| 2002/0190340 | A1 | | 12/2002 | Moriguchi et al. |
| 2003/0080355 | A1 | | 5/2003 | Shirai et al. |

FOREIGN PATENT DOCUMENTS

| | | |
|---|---|---|
| EP | 1 204 145 A2 | 5/2002 |
| JP | 62-76671 | 4/1987 |
| JP | 2-126682 | 5/1990 |
| JP | 3-226291 | 10/1991 |
| JP | 5-198816 | 8/1993 |
| JP | 6-120347 | 4/1994 |
| JP | 7-115193 | 5/1995 |
| JP | 09-102607 | 4/1997 |
| JP | 10-136641 | 5/1998 |
| JP | 10-136642 | 5/1998 |
| JP | 11-274482 | 10/1999 |
| JP | 2002-203967 | 7/2002 |
| JP | 2002-203967 A | 7/2002 |
| JP | 2002-373989 A | 12/2002 |
| JP | 2003-133557 A | 5/2003 |
| JP | 2003-526949 A | 9/2003 |
| JP | 2004-289103 | 10/2004 |
| JP | 2005-501408 A | 1/2005 |
| JP | 2005-101551 | 4/2005 |
| WO | WO 03/010812 A1 | 2/2003 |

OTHER PUBLICATIONS

U.S. Appl. No. 11/996,880, filed Jan. 25, 2008.
European Search Report issued in European Patent Application No. 06781411.1, mailed Apr. 6, 2009.
European Search Report issued in European Patent Application No. 06781438.4, mailed Apr. 6, 2009.
European Search Report issued in European Patent Application No. 06767985.2, mailed Apr. 6, 2009.
Belverde, G., et al., "A Low-Voltage MOSFET with Small on-Resistance: an Extended Characterization in High-Efficiency Power Converter Applications", Conference Record of the 2001 IEEE Industry Applications Conference 36th IAS Annual Meeting, Sep.-Oct. 2001, pp. 635-640, USA.

* cited by examiner

# SEMICONDUCTOR DEVICE AND ELECTRIC APPARATUS HAVING A SEMICONDUCTOR LAYER DIVIDED INTO A PLURALITY OF SQUARE SUBREGIONS

RELATED APPLICATIONS

This application is the U.S. National Phase under 35 U.S.C. §371 of International Application No. PCT/JP2006/313575, filed on Jul. 7, 2006, which in turn claims the benefit of Japanese Application No. 2005-200517, filed on Jul. 8, 2005, the disclosures of which Applications are incorporated by reference herein.

TECHNICAL FIELD

The present invention relates to a semiconductor device and an electric apparatus, and particularly to an improvement technology of a power semiconductor device used for inverter control of various electric apparatuses.

BACKGROUND ART

In light of an energy loss reduction, a wide band-gap semiconductor (such as silicon carbide (SiC)) are attracting attention as a semiconducting material which goes beyond the limit of an existing Si power field effect transistor (hereinafter referred to as "Si-MISFET").

Since a SiC semiconductor has a wide band gap, a drift region of a power field effect transistor (hereinafter referred to as "SiC-MISFET") made of the SiC semiconductor has an excellent high withstand voltage performance. This realizes the reduction in thickness of the drift region which plays an important role to improve a conduction loss caused due to the decrease in an on-resistance (Ron) per unit area of a semiconductor device while securing a certain withstand voltage.

To be specific, since the wide band-gap semiconductor is used, the on-resistance of the SiC-MISFET is much lower than the on-resistance of the Si-MISFET, and is expected to be lower than the on-resistance of a Si-IGBT whose resistance value is 1 or more digits smaller than the on-resistance of the Si-MISFET. Therefore, compared to these existing switching elements, heat generated when the SiC-MISFET is ON can be suppressed, and the conduction loss of the SiC-MISFET can be kept low.

Moreover, since the SiC-MISFET is a unipolar device, its switching performance is advantageous in the increase in speed, compared to a bipolar device (for example, IGBT).

However, even in the case of the SiC-MISFET, by a parasitic diode comprised of a PN junction of a P-type region and an n-type region in a semiconductor device, a reverse recovery time delay may occur in the case of switching from an ON state of the parasitic diode to an OFF state of the SiC-MISFET when a reverse bias is applied.

For example, when a positive voltage that is a counter electromotive voltage generated by an inductance load when the switching element is turned off is applied to a source electrode, positive holes as minority carriers are implanted in the n-type region via the parasitic diode, and this causes the reverse recovery time delay of the operation of the parasitic diode.

In the past, the present inventors developed a semiconductor device in which a Schottky diode and a MISFET are incorporated as one chip, both a semiconductor region of the Schottky diode and a drift region of the MISFET being made of an SiC material (see Patent Document 1).

In the semiconductor device described in Patent Document 1 (hereinafter referred to as "conventional semiconductor device"), a metal electrode which forms a Schottky junction with an n-type epitaxial layer is provided on the surface of the n-type epitaxial layer existing between p-type wells of adjacent MISFETs. In this conventional semiconductor device, even assuming that the positive voltage is applied to the source electrode, and the positive holes as the minority carriers are implanted in the n-type region, the Schottky diode can quickly absorb the minority carriers (positive holes) as soon as a negative voltage is applied to the source electrode, and the reverse recovery time by the parasitic diode can be shortened.

Moreover, in this conventional semiconductor device, a forward rising voltage (about 1 V) of the Schottky diode is lower than a forward rising voltage (3 V) of the parasitic diode (PN junction). Therefore, when the positive voltage is applied to the source electrode, a forward current preferentially flows to the Schottky diode (the Schottky electrode has the same voltage as the source electrode). As a result, the implanting of the minority carriers via the parasitic diode is effectively avoided.

Furthermore, in this conventional semiconductor device, since the Schottky diode and the MISFET can be integrated in one chip, the reduction in space of the semiconductor device can be realized.

Patent Document 1: Japanese Unexamined Patent Publication No. 2002-203967 (FIGS. 1 and 2)

DISCLOSURE OF THE INVENTION

Problems to be Solved by the Invention

In the case of using the above conventional semiconductor device as the switching element composing a specific inverter power source circuit (for example, an inverter power source circuit for a three-phase motor of an air-conditioner compressor, etc.), there are the following problems for the practical application of such switching element.

The installation area of the metal electrode (Schottky electrode) of the Schottky junction does not cause harmful effects for the increase in speed of switching of the semiconductor device. However, considering that the forward voltage is applied to the parasitic diode in the MISFET and the Schottky diode, and the current is applied to these diodes, the installation area of the metal electrode is an important matter which should be considered in light of securing of an appropriate conduction ability.

In fact, the technology described in Patent Document 1 was applied to the inverter power source circuit for the three-phase motor. Discovered here was a possibility that the switching element breaks down due to the current which concentrates on the schottky electrode because of the counter electromotive voltage, as a trigger, generated based on the inductance load when the switching element is turned off.

Moreover, the schottky electrodes shown in FIG. 2 of Patent Document 1 are arranged in an orthogonal lattice manner in plan view so as to surround a field effect transistor region and be connected to a micro wiring. On this account, during fabrication of the semiconductor devices, the micro wiring tends to break, and this may become a factor for deteriorating fabrication yield of the semiconductor devices.

The present invention was made in view of these circumstances, and an object of the present invention is to provide a semiconductor device and an electric apparatus each of which can realize both high-speed switching operation and energy loss reduction and excels in resistance to current concentration based on the counter electromotive voltage generated by, for example, the inductance load of the electric apparatus.

Means for Solving the Problems

To solve the above problems, a semiconductor device according to the present invention comprises: a semiconductor layer made of a first conductivity type wide band-gap semiconductor; a transistor cell in which a vertical field effect transistor is formed, the vertical field effect transistor causing a charge carrier to move in a thickness direction of the semiconductor layer; and a diode cell in which a schottky diode is formed, the schottky diode being formed such that a schottky electrode forms a schottky junction with the semiconductor layer, wherein the semiconductor layer is divided into a plurality of square subregions based on virtual border lines in plan view and includes the subregion as the transistor cell and the subregion as the diode cell.

Note that the plurality of the subregions may be arranged in a matrix manner in two directions orthogonal to each other.

In accordance with the semiconductor device thus constructed, since the field effect transistor (switching element) made of the wide band-gap semiconductor and the schottky diode (built-in diode) using the wide band-gap semiconductor are used, it is possible to realize the increase in speed compared to the existing bipolar device (IGBT).

Moreover, the on-resistance of the field effect transistor made of the wide band-gap semiconductor is sufficiently smaller than that of the existing switching element (such as Si-MISFET or IGBT). Therefore, heat generated when the field effect transistor is ON can be suppressed, and the conduction loss can be kept low.

Furthermore, the schottky electrode can widely occupy substantially the entire area of the transistor cell. Therefore, for example, it is possible to take appropriate measures against the breakdown of the switching element due to the current which concentrates on the electrode of the schottky diode because of the counter electromotive voltage, as a trigger, generated based on the inductance load of the three-phase motor when the switching element is turned off.

The field effect transistor may include: a second conductivity type well provided on a surface of the semiconductor layer; a first conductivity type region provided inside the well; a drift region as the semiconductor layer other than the well and the region; a first source/drain electrode provided so as to contact the region and the well; a gate electrode provided on the well with an insulating layer disposed between the gate electrode and the well; and a second source/drain electrode connected to a back surface of the drift region in an ohmic manner.

The term "source/drain electrode" means that it can function as a source electrode of a transistor or a drain electrode of a transistor.

The diode cells may be provided so as to be surrounded by the transistor cells.

With this, the diode cell can be suitably provided on the surface of the drift region such that the area ratio of the surface area of all the diode cells to the surface area of all the subregions is kept within an appropriate range.

Specifically, a ratio of an area of all the transistor cells in plan view to an area of all the subregions in plan view may be more than 0.5 and not more than 0.99. In other words, a ratio of an area of all the diode cells in plan view to an area of all the subregions in plan view may be more than 0.01 and not more than 0.5.

Even when the area ratio of the surface area of all the diode cells to the surface area of all the subregions is set to 0.01 (1%) or 0.5 (50%), it is possible to reduce the loss compared to the semiconductor device adopting the conventional PN junction diode. Meanwhile, when the area ratio is 0.01 or less, the value of the current flowing in the schottky diode is likely to exceed its allowable current value. When the area ratio is more than 0.5, the tendency of the increase in the on-resistance is confirmed due to the decrease in the share of the area of the field effect transistor.

Moreover, in light of securing a space for vertically applying the drift current along a side wall surface of the second conductivity type well, a surface area of the well included in each of the transistor cells in plan view may be smaller than a surface area of the schottky electrode included in each of the diode cells in plan view.

The present invention is applicable to a semiconductor device having an inverter power source circuit of an AC driving device, and for example, to an apparatus in which the semiconductor device is incorporated as an arm module.

In accordance with the electric apparatus thus constructed, the conduction loss of the semiconductor device corresponds to a value obtained by multiplying the current by the voltage (current×voltage). Therefore, since the forward voltage of the schottky diode can be kept lower than the forward voltage of the conventional PN junction diode, the loss of the semiconductor device is improved compared to the existing semiconductor device adopting the PN junction diode.

Furthermore, the switching speed of the semiconductor device from the ON state to the OFF state increases. Therefore, the switching loss can be decreased.

A voltage applied to a built-in parasitic diode of the field effect transistor and the schottky diode based on a counter electromotive voltage generated by an inductance load in the AC driving device may be higher than a forward rising voltage of the schottky diode and lower than a forward rising voltage of the built-in parasitic diode.

One example of the AC driving device is an AC motor driven by the inverter power source circuit. The AC motor drives, for example, an air-conditioner compressor.

The above object, other objects, features, and advantages of the present invention will be made clear by the following detailed explanation of preferred embodiments with reference to the attached drawings.

Effects of the Invention

The present invention can provide a semiconductor device and an electric apparatus each of which can realize both high-speed switching operation and energy loss reduction and excels in resistance to current concentration based on the counter electromotive voltage generated by, for example, the inductance load of the electric apparatus.

EXPLANATION OF REFERENCE NUMBERS 2 semiconductor substrate
3 SiC layer
4 p-type well
4c channel region
5 source region
6 source electrode
7 gate insulating film
8 gate electrode
9 schottky electrode
10 drain electrode
11 first wiring
12 gate wiring
20 input terminal
21 high voltage feed terminal
22 ground terminal
30 border line
30a horizontal border line
30b vertical border line
100 semiconductor device
100H upper arm module
100L lower arm module
101T transistor cell
101S diode cell
102 SiC-MISFET
103 schottky diode
105 inverter motor drive system
106 three-phase inverter power source circuit
107 three-phase motor
108 phase switching circuit
110 connection portion
G gate terminal
S source terminal
D drain terminal
H1, H2 contact hole

BEST MODE FOR CARRYING OUT THE INVENTION

Hereinafter, a preferred embodiment of the present invention will be explained with reference to the drawings.

Figure 1:
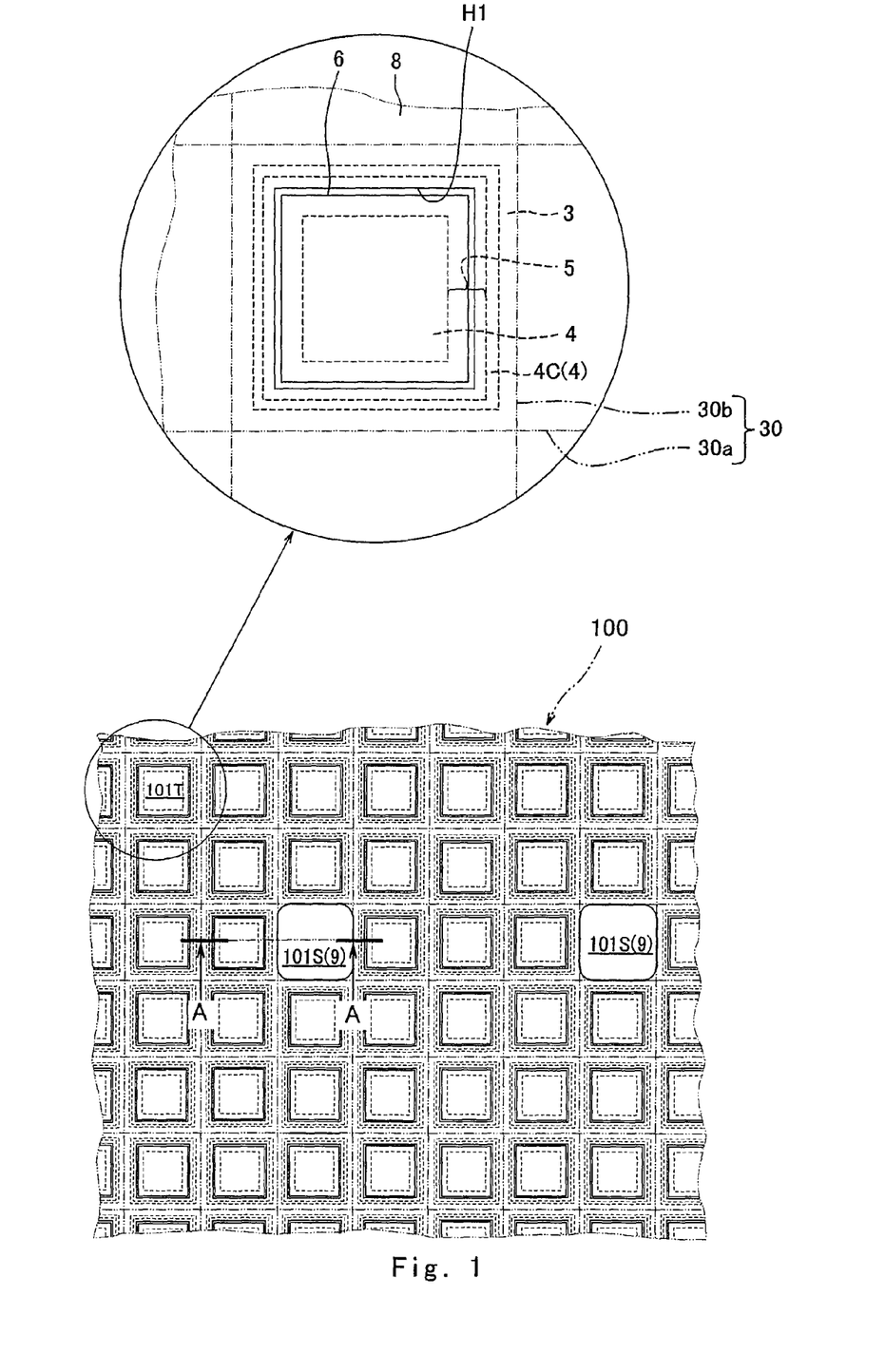
FIG. 1 is a plan view showing one example of a construction of a semiconductor device according to an embodiment of the present invention.
Figure 2:
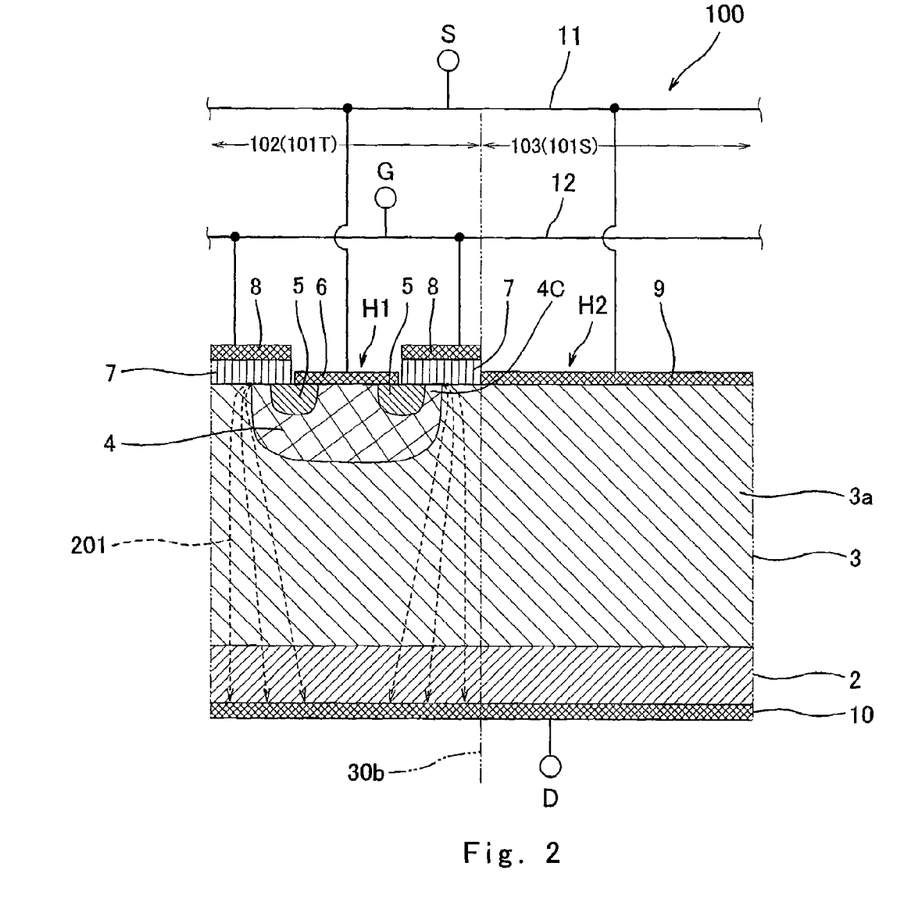
FIG. 2 is a sectional view of the semiconductor device as taken along line A-A of FIG. 1.

FIG. 1 is a plan view showing one example of a construction of a semiconductor device according to an embodiment of the present invention. FIG. 2 is a sectional view of the semiconductor device as taken along line A-A of FIG. 1. In the following explanation, "n" and "p" denote a conductivity type, and in such type of layer or region, electrons or positive holes are carriers. In addition, "+" denotes high impurity concentration, and "−" denotes low impurity concentration.

As shown in FIGS. 1 and 2, in a semiconductor device 100 in plan view, a SiC layer 3 (semiconductor layer) is constructed such that a plurality of quadrangular (square, herein) subregions 101T and 101S are arranged evenly (equal area) in a matrix manner in two directions intersecting (orthogonal to) each other by a plurality of border lines 30 comprised of virtual horizontal border lines 30a and virtual vertical border lines 30b.

Among the subregions 101T and 101S arranged by the border lines 30, there are a subregion corresponding to a transistor cell 101T in which a vertical field effect transistor 102 (see FIG. 2; hereinafter referred to as "SiC-MISFET 102".) which causes the electrons to move in a thickness direction of the SiC layer 3 is formed, and a subregion corresponding to a diode cell 101S in which a schottky electrode 9 which forms a schottky junction with the SiC layer 3 (drift region 3a) is formed.

For ease of explanation of the claims and description, the border lines 30 shown by two-dot chain lines in FIG. 1 are virtual lines extending in a vertical direction or a horizontal direction so as to be located equidistant from the centers of adjacent subregions 101T and from the centers of adjacent subregions 101T and 101S. The border lines 30 do not exist in a product obtained by embodying the present technology. Depending on the shape of the SiC-MISFET 102 or the schottky diode 103, the border lines 30 shown are changed suitably.

Even when the subregions 101T and 101S are arranged by the virtual lines, the SiC-MISFET 102 or the schottky electrode 9 is formed in each of the subregions 101T and 101S. Therefore, as is easily understood from explanations regarding FIG. 1 and FIG. 4 described below, determining the centers of the gate electrode 8 and the schottky electrode 9 depending on their shapes determines the virtual border lines 30. As a result, the subregions 101T and 101S can be specified.

Figure 4:
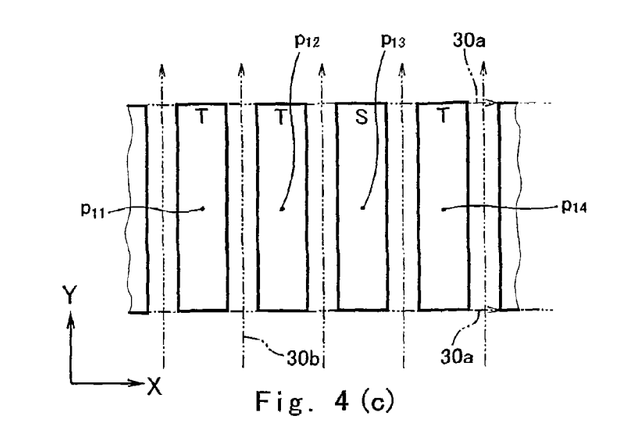
FIG. 4 are views explaining specific examples of virtual border lines of the present embodiment.

As shown in FIG. 4, various arrangement patterns can be assumed as actual arrangements of the SiC-MISFET 102 and the schottky diode 103. Therefore, examples for specifying the virtual border lines 30, corresponding to respective arrangement patterns in FIG. 4, are explained with reference to FIG. 4.

For the purpose of simplification of FIG. 4 and the following explanation, the SiC-MISFET 102 is abbreviated as an element "T", and the schottky diode 103 is abbreviated as an element "S". In addition, for the sake of convenience of explanation, a direction in which the horizontal border line 30a extends is referred to as an "X direction", and an arrangement of respective elements (the number of which may be one) lined up in the X direction is referred to as a row direction arrangement. Moreover, a direction in which the vertical border line 30b extends is referred to as a "Y direction", and an arrangement of respective elements (the number of which may be one) lined up in the Y direction is referred to as a column direction arrangement.

FIG. 4(a) shows square elements T and S arranged in a matrix manner of 3 rows and 3 columns. Such arrangement pattern of the elements T and S is the same kind as that of the SiC-MISFET 102 and the schottky diode 103 shown in FIGS. 1 and 2.

FIG. 4(a) shows an example in which the square element S exists only in a center portion defined by the second row and the second column, however such example of the shape and the arrangement is just set appropriately for the purpose of explaining a specific example of the border lines 30. For example, the specific shape of the elements T and S does not have to be square, and may be circular, triangular, or polygonal (pentagonal or more) as long as its center is determined properly.

When the elements T and S whose shapes are significantly different from each other (for example, the element T is square, and the element S is triangular) are mixedly arranged in the semiconductor device, an area ratio, described below, regarding the total number of the subregions 101T and the total number of the subregions 101S, may need to be modified based on a suitable correction coefficient.

Since the elements T and S existing in respective portions of 3 rows and 3 columns are square, a center $P_{ij}$ (i=1 to 3, j=1 to 3) of each element is uniquely determined as an intersection point of diagonal lines of the square as shown in FIG. 4(a).

The horizontal border line 30a shown in FIG. 4(a) is a virtual line extending in the X direction so as to be located equidistant from centers $P_{11}$ and $P_{21}$ of a pair of elements T adjacent to each other in a column direction, centers $P_{12}$ and $P_{22}$ of the elements T and S adjacent to each other in the column direction, and centers $P_{13}$ and $P_{23}$ of a pair of elements T adjacent to each other in the column direction.

The vertical border line 30b shown in FIG. 4(a) is a virtual line extending in the Y direction so as to be located equidistant from the centers $P_{11}$ and $P_{12}$ of a pair of elements T adjacent to each other in a row direction, the centers $P_{21}$ and $P_{22}$ of the elements T and S adjacent to each other in the row direction, and centers $P_{31}$ and $P_{32}$ of a pair of elements T adjacent to each other in the row direction.

The virtual border lines 30 other than the horizontal border line 30a and the vertical border line 30b shown in FIG. 4(a) can be easily specified with reference to the above explanation and FIG. 4(a), so that detailed explanations of these border lines 30 are omitted here.

FIG. 4(b) shows the square elements T and S arranged in a staggered manner (zigzag alignment). To be specific, each of the elements T and S constituting the second row shifts in the X direction by half a pitch of each of the elements T constituting the first row or the third row relative to each of the elements T constituting the first row or the third row. As shown in FIG. 4(b), the arrangement pattern of the elements T and S has 6 columns. As a result, the element T or S is not arranged in some of respective portions of 3 rows and 6 columns (for example, no element is provided in a portion defined by the second row and the third column).

FIG. 4(b) shows an example in which the square element S exists only in a portion defined by the second row and the fourth column, however such example of the shape and the arrangement is just set appropriately for the purpose of explaining a specific example of the border lines 30. For example, the specific shape of the elements T and S does not have to be square, and may be circular, triangular, or polygonal (pentagonal or more) as long as its center is determined properly.

When the elements T and S whose shapes are significantly different from each other (for example, the element T is square, and the element S is triangular) are mixedly arranged in the semiconductor device, the area ratio, described below, regarding the total number of the subregions 101T and the total number of the subregions 101S, may need to be modified based on a suitable correction coefficient.

Since the elements T and S existing in proper places of respective portions of 3 rows and 6 columns are square, a center Pij (i=1 to 3, j=1 to 6, except for $P_{12}, P_{14}, P_{16}, P_{21}, P_{23}, P_{25}, P_{32}, P_{34}$ and $P_{36}$) of each element is uniquely determined as an intersection point of diagonal lines of the square.

The horizontal border line 30a (shown by a thin chain double-dashed line in FIG. 4(b)) shown in FIG. 4(b) is a virtual line extending in the X direction so as to pass through a midpoint (The midpoint is shown by a black dot in FIG. 4(b). The same is true in the following explanation.) on a zigzag line 200 (dotted line) extending between the center $P_{11}$ of the element T defined by the first row and the first column and the center $P_{22}$ of the element T defined by the second row and the second column which elements are adjacent to each other in a row-column direction (oblique direction), a midpoint on the zigzag line 200 extending between the center $P_{22}$ of the element defined by the second row and the second column and the center $P_{13}$ of the element T defined by the first row and the third column which elements are adjacent to each other in the row-column direction, a midpoint on the zigzag line 200 extending between the center $P_{13}$ of the element T defined by the first row and the third column and the center $P_{24}$ of the element S defined by the second row and the fourth column which elements are adjacent to each other in the row-column direction, a midpoint on the zigzag line 200 extending between the center $P_{24}$ of the element S defined by the second row and the fourth column and the center $P_{15}$ of the element T defined by the first row and the fifth column which elements are adjacent to each other in the row-column direction, and a midpoint on the zigzag line 200 extending between the center $P_{15}$ of the element T defined by the first row and the fifth column and the center $P_{26}$ of the element T defined by the second row and the sixth column which elements are adjacent to each other in the row-column direction.

The vertical border line 30b (shown by a thick chain double-dashed line in FIG. 4(b)) shown in FIG. 4(b) is a virtual line comprised of three Y portions 30Y extending in the Y direction and two X portions 30X connecting ends of the Y portions and extending in the X direction, so as to be located equidistant from the centers $P_{11}$ and $P_{13}$ of a pair of elements T adjacent to each other in the row direction, the centers $P_{22}$ and $P_{24}$ of the elements T and S adjacent to each other in the row direction, and the centers $P_{31}$ and $P_{33}$ of a pair of elements T adjacent to each other in the row direction.

The virtual border lines 30 other than the horizontal border line 30a and the vertical border line 30b shown in FIG. 4(b) can be easily specified with reference to the above explanation and FIG. 4(b), so that detailed explanations of these border lines 30 are omitted here.

FIG. 4(c) shows four rectangular elements T and S lined up in the X direction. To be specific, the elements T and S seamlessly extend in the Y direction and are arranged in a striped manner.

FIG. 4(c) shows an example in which the rectangular element S exists only in a portion defined by the third column, however such example of the shape and the arrangement is just set appropriately for the purpose of explaining a specific example of the border lines 30. For example, the specific shape of the elements T and S does not have to be rectangular, and may be elliptical or triangular as long as its center is determined properly.

When the elements T and S whose shapes are significantly different from each other (for example, the element T is rectangular, and the element S is triangular) are mixedly arranged in the semiconductor device, the area ratio, described below, regarding the total number of the subregions 101T and the total number of the subregions 101S, may need to be modified based on a suitable correction coefficient.

Since the elements T and S are rectangular, a center Pij (i=1, j=1 to 4) of each element is uniquely determined as an intersection point of diagonal lines of the rectangle.

The vertical border line 30b shown in FIG. 4(c) is a virtual line extending in the Y direction so as to be located equidistant from the centers $P_{11}$ and $P_{12}$ of a pair of elements T adjacent to each other in the row direction.

In FIG. 4(c), there are no elements T and S adjacent to each other in the column direction. Therefore, selected as the horizontal border lines are such a pair of virtual lines that a distance between one of the virtual lines and the center ($P_{11}$, $P_{12}$, $P_{13}$ and $P_{14}$) of each of a plurality of (four, herein) elements T adjacently lined up in the row direction is equal to a distance between the other one of the virtual lines and the center ($P_{11}$, $P_{12}$, $P_{13}$ and $P_{14}$) of each of the elements T. As an example of such virtual lines, a pair of horizontal border lines 30a are shown, one of which passes through one side surfaces of the elements T and S and the other passes through the other side surfaces of the elements T and S.

The border lines 30 other than the horizontal border lines 30a and the vertical border line 30b shown in FIG. 4(c) can be easily specified with reference to the above explanation and FIG. 4(c), so that detailed explanations of these border lines 30 are omitted here.

FIG. 4(d) shows the square elements T arranged in a matrix manner and the rectangular element S. The arrangement pattern of the elements T and S shown in FIG. 4(d) is the same as the arrangement pattern of the elements T and S shown in FIG. 4(a) except that the element S in FIG. 4(d) occupies two subregions and extends in the Y direction so as to intersect the horizontal border line 30a.

Therefore, explanations of the border lines 30 other than the horizontal border line 30a intersecting the element S are omitted here.

The horizontal border line 30a, shown in FIG. 4(d), intersecting the element S is a virtual line extending in the X direction so as to be located equidistant from the centers $P_{21}$ and $P_{31}$ of a pair of elements T adjacent to each other in the column direction and the centers $P_{23}$ and $P_{33}$ of a pair of elements T adjacent to each other in the column direction. To be specific, the horizontal border line 30a is defined based on a pair of elements T existing on both sides of the element S in the X direction.

In many cases, the arrangement pattern and shape of the product manufactured by embodying the elements T and S are not manufactured according to its blueprint due to various disturbances. For example, due to mask displacement which occurs in the process of manufacturing the elements T and S, it may be difficult to specify the above-described border line which is located equidistant from the centers of the elements T and S.

In this case, the border line does not have to be located severely equidistant from the centers of the elements T and S in view of, for example, the manufacturing displacement of the elements T and S.

To be specific, the above-described examples for specifying the border lines are based on the assumption that the elements T and S are ideally manufactured according to its blueprint. The specifying of the border lines is suitably modified for each product embodying the elements T and S according to the product.

Thus, the subregions 101T and 101S are arranged by the virtual horizontal border lines 30a and the virtual vertical border lines 30b so that the square subregions 101T and 101S arranged in two directions intersecting each other are the same in area as each other. As a result, the area ratio, described below, can be appropriately obtained by using the total number of the subregions 101T and the total number of the subregions 101S.

The diode cells 101S acting as the schottky diodes 103 are suitably distributed so that each diode cell 101S is surrounded by the transistor cells 101T acting as the SiC-MISFETs 102. Thus, the number of the diode cells 101S is properly adjusted relative to the number of the transistor cells 101T.

More specifically, in the semiconductor device 100, where the total number of the diode cells 101S (subregions 101S) acting as the schottky diodes 103 is A, and the total number of the transistor cells 101T (subregions 101T) acting as the SiC-MISFETs 102 is B, an area ratio (A/(A+B)) obtained by dividing the total number A of the diode cells 101S acting as the schottky diodes 103 by the total number (A+B) of the subregions 101S and 101T is set in a numerical range of more than "0.01" to not more than "0.5" in view of the conduction loss of the semiconductor device 100 described below.

In brief, the area ratio (A/(A+B)) corresponds to a ratio of the area of all the diode cells 101S (subregions 101S) in plan view to the area of all the subregions 101S and 101T in plan view.

For the same purpose as above, an area ratio (B/(A+B)) obtained by dividing the total number B of the transistor cells 101T acting as the SiC-MISFETs 102 by the total number (A+B) of the subregions 101T and 101S is set in a range of more than "0.5" to not more than "0.99".

In brief, the area ratio (B/(A+B)) corresponds to a ratio of the area of all the transistor cells 101T (subregions 101T) in plan view to the area of all the subregions 101S and 101T in plan view.

As shown in FIG. 1 of the partially enlarged view and FIG. 2, in the transistor cell 101T, the SiC-MISFET 102 of the flat (planar) type includes: an $n^+$-type semiconductor substrate 2 made of a SiC semiconductor; an $n^-$-type SiC layer 3 which is formed on the surface of the semiconductor substrate 2 by the epitaxial growth method so as to have a predetermined thickness (10 μm for example); a p-type well 4 which is provided immediately below the surface of the SiC layer 3 and is square in plan view (see FIG. 1 of the enlarged view), and into which acceptors, such as aluminum ions, are implanted; an $n^+$-type source region 5 which is provided in a region of the p-type well 4 and is square and annular in plan view (see FIG. 1 of the enlarged view), and into which donors, such as nitrogen ions, are implanted; a drift region 3a which is a portion of the SiC layer 3 other than the source region 5 and the p-type well 4; a channel region 4c which is a portion of the p-type well 4, the portion being located around an outer periphery of the source region 5, and is square and annular in plan view (see FIG. 1 of the enlarged view); a gate insulating film 7 which is deposited so as to cover the channel region 4c, step over the outer periphery of the source region 5, extend toward the inner side of the source region 5 and covers a part of the source region 5, and is made of a $SiO_2$ material; a gate electrode 8 which is formed on the entire surface of the gate insulating film 7 so as to face the channel region 4c, and is made of aluminum (Al); a source electrode 6 which covers a center portion of the p-type well 4 (portion located in a center opening of the source region 5), steps over the inner periphery of the source region 5, extends toward the inner side of the source region 5 and squarely and annularly covers a part of the source region 5, and is square in plan view (see FIG. 1 of the enlarged view); and a drain electrode 10 which is formed on the entire back surface of the semiconductor substrate 2 so as to be connected to the back surface of the drain region 3a in an ohmic manner.

Used as a material of the drain electrode 10 and the source electrode 6 is, for example, nickel (Ni).

As is easily understood from FIGS. 1 and 2, a large number of the SiC-MISFETs 102 share the drift region 3a and the drain electrode 10, are integrated in one chip and are arranged in parallel.

As shown by dotted line arrows 201 in FIG. 2, electrons moving from the $n^+$-type source region 5 toward the drain electrode 10 moves in a lateral direction (horizontal direction) in the vicinity of the p-type well 4. Therefore, to secure a space for such movement of the electrons, the surface area of the p-type well 4 is set to be smaller than the surface area of the transistor cell 101T (subregion 101T).

Moreover, the gate insulating film 7 and the gate electrode 8 are formed on the entire surface of the SiC layer 3 except for contact holes H1 and H2. Meanwhile, the contact hole H1 is formed on the gate insulating film 7 so as to be located in the transistor cell 101T, and the source electrode 6 is formed in the contact hole H1.

The source electrode 6 and the semiconductor (SiC layer 3) are connected to each other in an ohmic manner by the source region 5 and the p-type well 4, and the drain electrode 10 and the semiconductor (SiC layer 3) are connected to each other in an ohmic manner by the semiconductor substrate 2.

The SiC layer 3 (band gap of SiC: 3.02 eV) is made of a wide band-gap semiconductor whose band gap is wider than that of a silicon semiconductor (band gap: 1.11 eV) and that of a GaAs semiconductor (band gap: 1.43 eV).

The wide band-gap semiconductor is a semiconductor whose energy band gap (that is a material parameter which defines a property of a semiconductor) is wider than that of the silicon semiconductor and that of the GaAs semiconductor. In the present description, the term "wide band-gap semiconductor" is a generic name for semiconducting materials having the band gap of, for example, 2 eV or more.

In addition to SiC, examples of a wide band-gap semiconducting material are group III nitride, such as GaN (band gap: 3.39 eV) and AlN (band gap: 6.30 eV), and diamond.

As shown in FIG. 2, the schottky diode 103 is constructed such that the contact hole H2 is formed on the gate insulating film 7 so as to be located in the diode cell 101S, and the schottky electrode 9 (anode) which is rectangular (square, herein) in plan view of FIG. 1 and made of Ni is formed in the contact hole H2 so as to cover the entire surface of the SiC layer 3 (drift region 3a) of the diode cell 101S. In view of avoidance of electric field concentration, corners of the rectangular schottky electrode 9 may be rounded.

Since the current flowing from the schottky electrode 9 toward the drain electrode 10 flows in a longitudinal direction (vertical direction) throughout the entire area of the diode cell 101S, the surface area of the schottky electrode 9 is set to be substantially equal to the surface area of the diode cell 101S (subregion 101S), so that an adequately large amount of current can flow.

The drain electrode 10 is provided on the back surface of the semiconductor substrate 2 which faces the diode cell 101S so as to step over a boundary between the transistor cell 101T and the diode cell 101S. Via the drain electrode 10, a voltage is applied to the semiconductor (SiC layer 3) that is a cathode of the schottky diode 103.

Electric connection between the source electrodes 6 and electric connection between the source electrode 6 and the schottky electrode 9 are realized via a first wiring 11 (for example, a wiring constructed by a suitable interlayer insulating layer (not shown) and a suitable contact hole (not shown)). These source electrodes 6 and schottky electrodes 9 are connected to a ground potential (negative voltage) side of a power source via a source terminal S provided at an appropriate position of a semiconductor package (not shown).

That is, the schottky electrode 9 is electrically connected to the source electrode 6 via the first wiring 11.

Via a gate wiring 12 (for example, a wiring constructed by the above interlayer insulating layer and a suitable contact hole (not shown)) and a gate terminal G provided at an appropriate position of the semiconductor package, a predetermined control signal voltage is applied between the source electrode 6 and the gate electrode 8 formed in an orthogonal lattice manner on substantially the entire surface of the SiC layer 3 except for the regions of the contact holes H1 and H2 in plan view (see FIG. 2).

The drain electrode 10 is connected to a switching voltage (positive voltage) side of the power source via a drain terminal D provided at an appropriate position of the semiconductor package.

In the SiC-MISFET 102 of the semiconductor device 100, a voltage that is positive with respect to the source electrode 6 is applied to the gate electrode 8, so that the electrons are attracted by the channel region 4c, and the channel region 4c becomes the n-type. As a result, a channel is formed. Thus, the SiC-MISFET 102 is turned ON. The electrons moving from the source region 5 via the channel region 4c and the SiC layer 3 toward the drain electrode 10 mainly moves along routes shown by the dotted line arrows 201 of FIG. 2. As a result, a drift current flows in the SiC layer 3 in the longitudinal direction.

Moreover, when the forward voltage based on the counter electromotive voltage generated by the inductance load of the three-phase motor for example is applied to the parasitic diode (diode based on the PN junction between the p-type well 4 and the n⁻-type SiC layer 3) existing in the SiC-MISFET 102 and to the schottky diode 103 (between the source terminal S and the drain terminal D), the implanting of the minority carriers (positive holes) into the SiC layer 3 can be avoided appropriately by preferentially applying the forward current to the schottky diode 103, since the forward rising voltage (about 1 V) of the schottky diode 103 is lower than the forward rising voltage (3 V) of the parasitic diode (PN junction).

For the same reason as above, when a momentary overvoltage, such as a surge voltage, is applied to the semiconductor device 100, the overvoltage can be reduced by preferentially applying a leakage current, generated by the overvoltage, to the schottky diode 103. As a result, dielectric breakdown of the SiC-MISFET 102 can be prevented.

Furthermore, regarding a surge current, since the schottky electrode 9 and a PN junction diode are connected in parallel, the schottky diode 103 allows a certain current, corresponding to a region where a forward voltage $V_f$ is low, to flow at high speed, and the PN junction diode allows a large current, corresponding to a region where the forward voltage $V_f$ is high, to flow. As a result, breakdown of the schottky diode 103 by current concentration can also be prevented.

That is, the semiconductor device 100 of the present embodiment is an element whose resistance to the surge voltage and the surge current are high.

Even if the minority carriers are implanted into the p-type well 4 and the source region 5 when the PN junction diode is ON, the minority carriers are absorbed by the schottky electrode 9 immediately after the reverse bias is applied, and the PN junction diode can be set to an OFF state immediately. On this account, the semiconductor device 100 of the present embodiment can suppress the occurrence of so-called latch-up (that is, an OFF operation is not carried out quickly) which is a concern in a conventional FET having only a PN junction diode.

As examples of the construction of the SiC-MISFET, there are a planar type in which a p layer and an n layer are planarly formed on a semiconductor layer, and a trench type in which a thin, deep groove is formed and a gate electrode and a gate insulating film are embedded therein. The SiC-MISFET 102 of the present embodiment has a planar construction in consideration of various reasons, described below, such as a relation with the schottky diode 103.

As a publication describing a construction in which a trench type MISFET and a schottky diode are integrally formed, there is, for example, Published Japanese Translation of PCT Application 2005-501408 (hereinafter referred to as "prior example").

In this prior example, a schottky junction portion of a semiconductor and a metal is formed on a bottom surface of a trench (dug groove or hole) to construct a schottky diode. A trench portion is originally a portion composing a gap of a transistor unit element portion, and is different from a transistor unit element (a plurality of square subregions 101S and 101T arranged based on the virtual border lines of the present embodiment).

Meanwhile, the schottky diodes 103 of the present embodiment occupy substantially the entire subregions 101S that are a part of a plurality of square subregions 101S and 101T arranged based on the virtual border lines, which is totally different from the above construction in which the schottky electrode is embedded in (the trench portion of) the gap in the prior example.

Furthermore, the semiconductor device 100 of the planar construction of the present embodiment has such a structural flexibility that whether the SiC-MISFET 102 is provided or the schottky diode 103 is provided in a plurality of square subregions 101S and 101T arranged based on the virtual border lines can be selected arbitrarily. Therefore, the semiconductor device 100 of the planar construction of the present embodiment is advantageous over the semiconductor device adopting the trench construction as in the prior example. That is, with such structural flexibility, it is possible to embody the design concept (the area ratio between the SiC-MISFET 102 and the schottky diode 103 can be set arbitrarily) of the present embodiment.

Moreover, in the prior example, it is necessary to form the gate electrode on a trench wall surface with the gate insulating film disposed between the gate electrode and the trench wall surface, secure insulation by an interlayer insulating film, and further form the schottky electrode thereon. In the case of forming the above-described insulating film, electrode film and insulating film on the trench wall surface, it is difficult to form the schottky electrode, having a large area, on the bottom surface portion of the trench covered by the above-described multiple layers, and only a part of the bottom surface of the trench functions as the schottky diode. Therefore, the area for forming the diode is limited to be small, which is problematic. Meanwhile, in the semiconductor device 100 of the planar construction of the present embodiment, it is possible to appropriately solve such problem regarding the limitation of the area.

Moreover, in the case of forming the schottky electrode on the bottom surface of the trench in the prior example, the schottky electrode is located near the drain electrode on the back surface. Therefore, an electric field concentration occurs at the schottky electrode, so that the withstand voltage of the schottky electrode is a concern. However, in the semiconductor device 100 of the planar construction of the present embodiment, the schottky electrode 9 is formed on the surface of the SiC layer 9, whereas the p-type well 4 in the adjacent SiC-MISFET 102 is formed deep. Therefore, the electric field concentration does not occur at the schottky electrode 9, and the withstand voltage is secured appropriately.

As described above, the semiconductor device 100 of the present embodiment adopting the planar construction is advantageous over the semiconductor device having the trench construction described in the prior example in that the area ratio between the SiC-MISFET 102 and the schottky diode 103 can be set arbitrarily, the withstand voltage can be secured appropriately, and the process of manufacturing the semiconductor device 100 can be simplified.

Moreover, in view of the resistance to high current and resistance to high voltage (described later) of the diode, the schottky diode 103 of the present embodiment uses the schottky electrode 9, made of Ni, as the anode, and the wide band-gap semiconductor (the SiC layer 3 herein as one example) as the cathode.

Assuming that the schottky diode is constructed using Ni as the anode and silicon as the cathode, it is difficult to supply high current to the schottky diode. That is, if the high current is applied to such schottky diode, a silicide layer tends to be formed at an interface between the silicon and Ni. As a result, these may be connected to each other in an ohmic manner, and may not function as a diode.

This case may stand against such a principle of the present embodiment for solving the problems that the dielectric breakdown of the SiC-MISFET can be prevented by preferentially applying the leakage current, generated by the overvoltage, to the schottky electrode.

Meanwhile, assuming that the schottky diode is constructed using Ni as the anode and the wide band-gap semiconductor (the SiC layer 3 as one example) as the cathode, the silicide layer is not substantially formed by a normally-performed conduction operation, which is preferable in view of the resistance to high current and resistance to high voltage of the diode.

That is, in the present embodiment, the structural difference regarding the cathode of the schottky diode 103 (difference regarding whether the cathode is silicon or SiC) is not just a design matter determined by a person with ordinary skill in the art, but a matter which directly leads to the above principle for solving the problems.

Furthermore, in the case of providing the diode on a peripheral portion, to which a high voltage is applied, of the semiconductor device 100, the schottky diode adopting Ni as the anode and SiC as the cathode excels in the withstand voltage compared to the schottky diode adopting Ni as the anode and silicon as the cathode.

Although the PN junction diode excels in both the resistance to high current and the resistance to high voltage, the loss of the semiconductor device by the increase of the forward voltage $V_f$ increases in the case of the PN junction diode adopting Ni as the anode and SiC as the cathode.

Next, a method for manufacturing the semiconductor device 100 according to the present embodiment will be explained with reference to FIG. 2.

Drawings showing components in the process of respective manufacturing steps are omitted. Therefore, when explaining the present manufacturing method, the reference numerals of the finished product shown in FIG. 2 are used for convenience as the reference numbers of respective components in the process of manufacturing steps.

First, prepared is the semiconductor substrate 2 having an offcut surface which is inclined in a [11-20] direction at 8 degrees from an n$^+$-type 4H-SiC(0001)Si surface in which nitrogen is doped so that the nitrogen concentration is $3 \times 10^{18}$ cm$^{-3}$.

Next, after the semiconductor substrate 2 is cleaned, the SiC layer 3 as a nitrogen-doped n$^-$-type epitaxial layer whose nitrogen concentration is adjusted to $1.3 \times 10^{16}$ cm$^{-3}$ is formed on the offcut surface by CVD so as to have a thickness of 10 μm.

Then, a mask (not shown) having openings is disposed on the surface of the SiC layer 3 such that the openings are located at appropriate positions of the surface of the SiC layer 3, multistage ion energy in a range of 30 to 700 keV directed toward the surface of the SiC layer 3 is suitably selected, and aluminum ion is implanted via the openings in a dose amount of $2 \times 10^{14}$ cm$^{-2}$. This ion implantation forms the p-type wells 4, each having a depth of about 0.8 μm, on the surface of the SiC layer 3 in an island manner.

After that, using another mask (not shown) having openings being disposed on the surface of the p-type well 4 such that the openings are located at appropriate positions of the surface of the p-type well 4, nitrogen ion whose energy is 30 to 180 keV is implanted in the p-type wells 4 in a dose amount of $1.4 \times 10^{15}$ cm$^{-2}$ so as to form the n$^+$-type source regions 5.

The semiconductor substrate 2 is subjected to an Ar atmosphere, kept at a temperature of 1,700 degrees C. and subjected to a heat treatment for about an hour, so that the above ion implanted regions are activated.

Next, the semiconductor substrate 2 is kept at a temperature of 1,100 degrees C. in an oxidation treatment furnace so as to be subjected to wet oxidation for three hours. This oxidation treatment forms a silicon oxide film (This film acts as a gate insulating film 7 eventually.), having a thickness of 40 nm, on the entire surface of the SiC layer 3.

The contact holes H1 and H2 are patterned on the silicon oxide film using photolithography and etching.

Then, the source electrode 6 made of Ni is provided on the surface of the SiC layer 3 inside the contact hole H1, and the drain electrode 10 made of Ni is provided on the back surface of the semiconductor substrate 2. After depositing these Ni layers, a suitable heat treatment is carried out. Thus, the electrode 6 and the semiconductor (SiC layer 3) are connected to each other in an ohmic manner via the source region 5 and the p-type well 4, and the electrode 10 and the semiconductor (SiC layer 3) are connected to each other in an ohmic manner via the semiconductor substrate 2.

Moreover, the gate electrode 8 made of Al and the gate wiring 12 are selectively patterned on the surface of the silicon oxide film.

Furthermore, the schottky electrode 9 made of Ni is selectively patterned on the surface of the SiC layer 3 exposing at the bottom of the contact hole H2.

Thus, the semiconductor device 100 (withstand voltage of 600V, rated current of 20 A in a square of 3 mm×3 mm) is obtained.

The following will describe an example in which the semiconductor device 100 according to the present embodiment is applied to an inverter power source circuit that is a power electronics control device of an electric apparatus.

Figure 3:
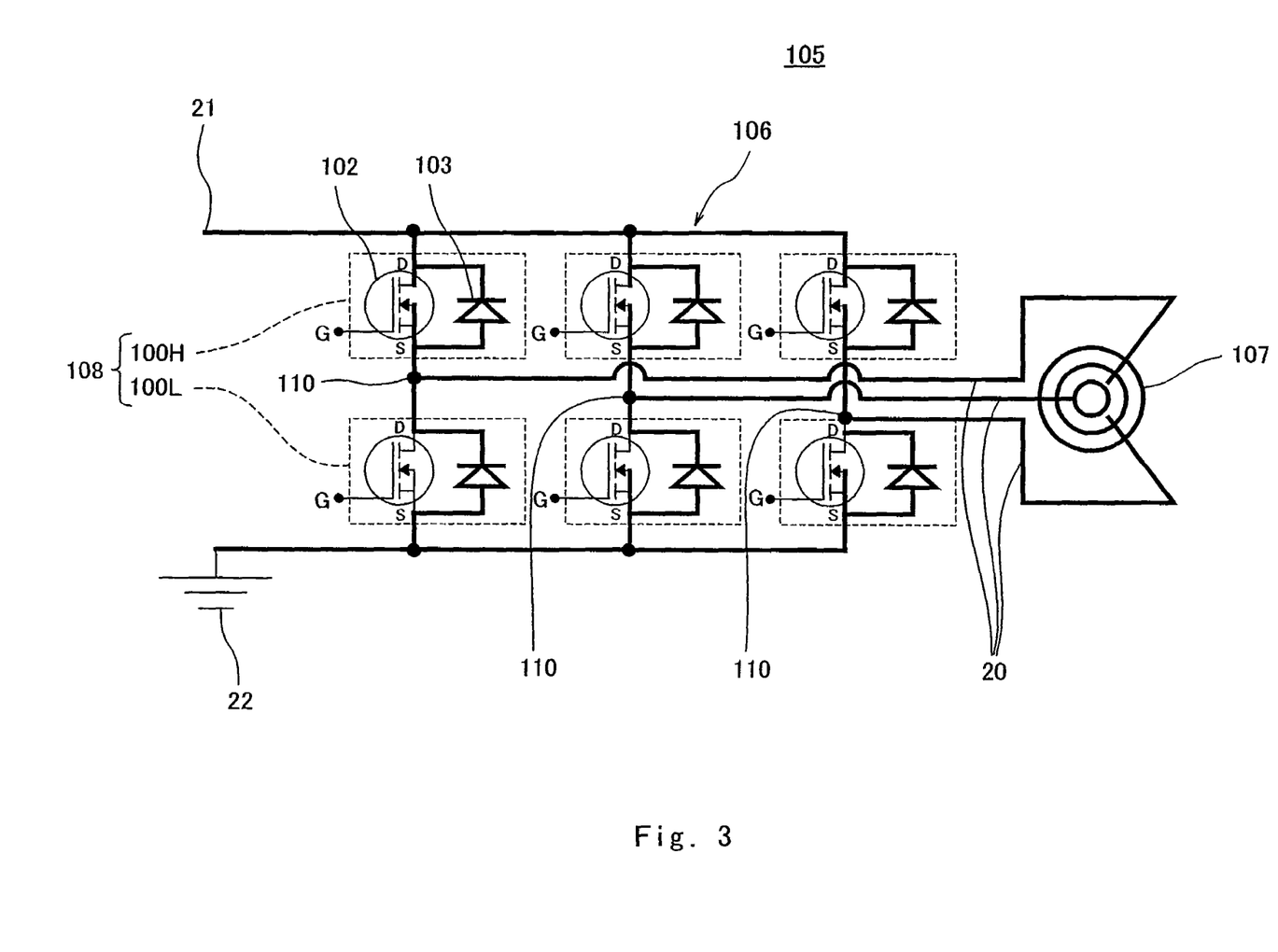
FIG. 3 is a view showing one example of a construction of an inverter motor drive system in which the semiconductor device according to the present embodiment is applied to a drive of a three-phase motor.

FIG. 3 is a view showing one example of a construction of an inverter motor drive system in which the semiconductor device according to the present embodiment is applied to a drive of a three-phase motor of an air-conditioner compressor.

As shown in FIG. 3, an inverter motor drive system 105 includes a three-phase inverter power source circuit 106 and a three-phase (AC) motor 107 (AC driving device).

The three-phase inverter power source circuit 106 includes six upper and lower arm modules 100H and 100 L (semiconductor devices) each constructed such that a circuit made by connecting the SiC-MISFET 102 and the schottky diode 103 in antiparallel is integrated in one chip.

More specifically, the three-phase inverter power source circuit 106 is constructed by connecting three pairs 108 of arm modules (hereinafter referred to as "phase switching circuit 108") in parallel, each pair being constructed by connecting, in series, the source terminal S (see FIG. 2) of the upper arm module 100H and the drain terminal D (see FIG. 2) of the lower arm module 100L.

Moreover, in each phase switching circuit 108, the drain terminal D of the upper arm module 100H is connected to a high voltage feed terminal 21, and the source terminal S of the lower arm module 100L is connected to a ground terminal 22.

Moreover, respective connection portions (midpoints) 110 where the source terminal S of the upper arm module 100H and the drain terminal D of the lower arm module 100L are connected are respectively connected to three input terminals 20 of the three-phase motor 107.

Gate terminals G (see FIG. 2) of the upper and lower arm modules 100H and 100L are connected to a control circuit (not shown) including a suitable inverter microcomputer.

In the inverter motor drive system 105, by adjusting ON and OFF timings of the upper arm module 100H and the lower arm module 100L provided in each phase switching circuit 108, it is possible to modulate the voltage of the connection portion 110 corresponding to the midpoint of each phase switching circuit 108.

In short, the voltage of the connection portion 110 is a ground potential when the lower arm module 100L is ON and the upper arm module 100H is OFF, and is a predetermined high voltage when the lower arm module 100L is OFF and the upper arm module 100H is ON.

Thus, in accordance with the switching frequency of ON or OFF of the upper and lower arm modules 100H and 100L, it is possible to change the power source frequency of the three-phase motor 107 to which power is supplied by the three-phase inverter power source circuit 106 via the connection portion 110, and also possible to change the rotating speed of the three-phase motor 107 freely, continuously and efficiently.

Since the inverter motor drive system 105 uses the SiC-MISFETs 102 (switching elements) and the schottky diodes 103 (built-in diodes), it can realize the increase in speed compared to the existing bipolar device (IGBT).

Therefore, the switching of the upper and lower arm modules 100H and 100L from ON to OFF is carried out in a short period of time, this removes the limitation of the upper limit of the frequency of the three-phase inverter power source circuit 106, and the switching loss of the three-phase inverter power source circuit 106 is improved.

As one example of specific data, a high frequency (100 kHz, or higher) switching operation was confirmed in the upper and lower arm modules 100H and 100L (withstand voltage of 600 V, rated current of 20 A in a square of 3 mm×3 mm,), and the switching loss in this case was 5% or less.

Moreover, the on-resistance of a region where the SiC-MISFET 102 is formed is sufficiently small compared to the existing switching element (such as Si-MISFET or IGBT). Therefore, the heat generated when the SiC-MISFET 102 in the inverter motor drive system 105 is ON can be suppressed, and the conduction loss can also be kept low.

Furthermore, in the schottky diode 103 built in each of the upper and lower arm modules 100H and 100L, the schottky electrode 9 can widely occupy substantially the entire diode cell 101S. Therefore, it is possible to take appropriate measures against the breakdown of the switching element due to the current which concentrates on the schottky electrode 9 because of the counter electromotive voltage, as a trigger, generated based on the inductance load of the three-phase motor 107 when the switching element is turned off.

Next, the following will explain examples of operations of the upper and lower arm modules 100H and 100L. In these examples, the loss of the inverter motor drive system 105 is considered using, as a parameter, the area ratio (A/(A+B)) of the area (A; the total number of the diode cells 101S) of the diode cells 101S in plan view to the area (A+B) of all the subregions 101T and 101S in plan view.

[Area Ratio $(A/(A+B))=0.01$ (1%)]

The on-resistance per unit area of a region where the schottky diode 103 in each of the upper and lower arm modules 100H and 100L (withstand voltage of 600 V, rated current of 20 A in a square of 3 mm×3 mm) is formed is about 1 mΩcm$^2$.

Moreover, the SiC layer 3 located immediately below the p-type well 4 of the SiC-MISFET 102 does not sufficiently function as a conduction region as shown by the dotted line arrows 201 in FIG. 2, whereas the SiC layer 3 located immediately below the schottky electrode 9 of the schottky diode 103 functions as the conduction region throughout its entire region. Therefore, the averaged on-resistance per unit area of the region where the SiC-MISFET 102 is formed is about 1 digit larger (10 mΩcm$^2$) than that of the schottky diode 103.

A contact resistance between the schottky electrode 9 and the SiC layer 3 is about 2 digits smaller than the on-resistance of the region where the schottky diode 103 is formed, and this resistance is negligible.

The current applied to the SiC-MISFET 102 and the schottky diode 103 is estimated from the above-described on-resistance of the region where the SiC-MISFET 102 is formed and on-resistance of the region where the schottky diode 103 is formed. When the area ratio (A/(A+B)) is set to 0.01 (the surface area of the diode cells 101S: the surface area of the subregions 101T and 101S≈1:100), the current of about 20 A/cm$^2$ (current density of the entire element) can be applied to the schottky diode 103 if the forward voltage $V_f$ of the schottky diode 103 including the forward rising voltage (about 1 V) generated by a schottky barrier is about 3 V (the increase in the forward voltage $V_f$ by a current which flows through a resistor is 2 V).

The above-described voltage value (3 V) corresponds to the lowest forward voltage (that is, the voltage due to a voltage dropped by a junction barrier of the PN junction) when the forward current is applied to the parasitic diode of the PN junction built in the SiC-MISFET 102. Therefore, the current is preferentially applied to the schottky diode 103 if the forward voltage $V_f$ is kept to 3 V or less when the forward current is applied to the schottky diode 103.

At this time, the conduction loss of the upper and lower arm modules 100H and 100L corresponds to a value obtained by multiplying the current by the voltage (current×voltage). Since the forward voltage $V_f$ of the schottky diode 103 can be kept lower than the forward voltage $V_f$ of the conventional PN junction diode, the loss of the upper and lower arm modules 100H and 100L adopting the schottky diodes 103 is expected to be improved compared to the existing arm module adopting the PN junction diode.

More specifically, when the area ratio (A/(A+B)) of the surface area (A) of all the diode cells 101S in the upper and lower arm modules 100H and 100L to the surface area (A+B) of all the subregions 101T and 101S in the upper and lower arm modules 100H and 100L is set to 0.01 (1%), the switching loss decreases due to the increase in an OFF speed, about 2% of the decrease in the loss is confirmed compared to the existing arm module adopting the PN junction diode, and the improvement effect of the loss of the inverter motor drive system 105 is achieved even if the ratio of the schottky diodes 103 is low (1%).

At this time, the averaged on-resistance per unit area of the region where the SiC-MISFET 102 is formed is 10 mΩcm$^2$. Therefore, the current density when the SiC-MISFET 102 is ON (hereinafter referred to as "ON current density") is estimated at 200 A/cm$^2$ when the increase in the forward voltage $V_f$ is 2 V. Note that the current when the SiC-MISFET 102 is ON (hereinafter referred to as "ON current") flows in a direction opposite the direction of the current flowing in the schottky diode 103.

That is, when the current whose current density is about 1/10 of the ON current density of the SiC-MISFET 102 is applied to the schottky diode 103 in a direction opposite the direction of the ON current, it is preferable that the area ratio (A/(A+B)) be set to 0.01 (1%).

During an experiment of a continuous operation of the upper and lower arm modules 100H and 100L, the operations of the upper and lower arm modules 100H and 100L were not stable due to the heat generation of the upper and lower arm modules 100H and 100L in some cases. This is estimated to be caused since the current flowing in the schottky diode 103 has exceeded the above-described allowable current (20 A/cm$^2$).

Therefore, it is desirable that the above-described ratio be set to a value of more than 0.01 in consideration of the current capacity limit of the region where the schottky diode 103 of the upper and lower arm modules 100H and 100L is formed.

[Area Ratio (A/(A+B))=0.1 (10%)]

When the area ratio (A/(A+B)) of the surface area (A) of all the diode cells 101S in the upper and lower arm modules 100H and 100L to the surface area (A+B) of all the subregions 101T and 101S in the upper and lower arm modules 100H and 100L is set to 0.1 (10%), the allowable value of the current flowing in the schottky diode 103 is about 200 A/cm$^2$ (current density of the entire element). Thus, a malfunction caused by the shortage of the current allowable amount of the schottky diode 103 is solved. In this case, about 5% of the decrease in the loss is confirmed compared to the existing arm module adopting the PN junction diode, and the sufficient improvement effect of the loss of the inverter motor drive system 105 is achieved.

At this time, the averaged on-resistance per unit area of the region where the SiC-MISFET 102 is formed is 10 mΩcm$^2$. Therefore, the ON current density of the SiC-MISFET 102 is estimated at 200 A/cm$^2$ when the increase in the forward voltage $V_f$ is 2 V. Note that the ON current of the SiC-MISFET 102 flows in a direction opposite the direction of the current flowing in the schottky diode 103.

That is, when the current whose current density is equal to the ON current density of the SiC-MISFET 102 is applied to the schottky diode 103 in a direction opposite the direction of the ON current, it is preferable that the area ratio (A/(A+B)) be set to 0.1 (10%).

[Area Ratio (A/(A+B))=0.5 (50%)]

As described above, the averaged on-resistance per unit area of the region where the SiC-MISFET 102 is formed is about 10 mΩcm$^2$. In the future, however, the on-resistance of the region where the SiC-MISFET 102 is formed can be decreased by, for example, the reduction in the channel resistance of the SiC-MISFET. As a result, the averaged on-resistance becomes close to the on-resistance (1 mΩcm$^2$) of the region where the schottky diode 103 is formed.

Although the on-resistance of the region where the SiC-MISFET 102 is formed does not become smaller than the on-resistance of the region where the schottky diode 103 is formed, these on-resistances may become substantially equal to each other. In this case, when the ON current densities of the ON currents respectively flowing in the SiC-MISFET 102 and the schottky diode 103 are equal to each other (note that the directions of these currents are opposite to each other), it is preferable that the area ratio (A/(A+B)) be set to 0.5 (50%).

When the area ratio (A/(A+B)) of the surface area (A) of all the diode cells 101S in the upper and lower arm modules 100H and 100L to the surface area (A+B) of all the subregions 101T and 101S in the upper and lower arm modules 100H and 100L is set to 0.5 (50%), about 1% of the decrease in the loss is confirmed compared to the existing arm module adopting the PN junction diode, and the improvement effect of the loss of the inverter motor drive system 105 is achieved even if the ratio of the schottky diodes 103 is high (50%).

When the area ratio (A/(A+B)) is set to more than 0.5, the increase in the on-resistance is confirmed due to the decrease in the share of the area of the region where the SiC-MISFET is formed. Therefore, the increase in the loss of the upper and lower arm modules 100H and 100L becomes a concern.

Furthermore, since stable operations are expected when the current flowing in the schottky electrode 9 is from 200 to 600 A/cm² (current density of the entire element), a desirable range of the area ratio (A/(A+B)) is 0.1 to 0.3.

As described above, in a case where the ON current densities of the ON currents respectively flowing in the SiC-MISFET 102 and the schottky diode 103 are equal to each other (note that the directions of these currents are opposite to each other), the area ratio (A/(A+B)) may be set to 0.1 when the on-resistance of the region where the schottky diode 103 is formed is 1/10 of the on-resistance of the region where the SiC-MISFET 102 is formed, and the area ratio (A/(A+B)) may be set to 0.3 when the on-resistance of the region where the schottky diode 103 is formed is 1/3 of the on-resistance of the region where the SiC-MISFET 102 is formed.

In the above embodiment, the SiC-MISFET is explained using the N channel type MISFET as an example. However, the semiconductor device 100 (arm module) according to the present embodiment can be constructed by using a P channel type MISFET in which the source electrode and the drain electrode are reversed.

Moreover, in the above embodiment, an example in which the gate electrode is made of aluminum is explained. However, instead of aluminum, the gate electrode may be made of polysilicon. Even when the gate electrode is made of polysilicon, the same operational effects as above can be obtained.

Moreover, in the present embodiment, an example in which nickel (Ni) is used as materials of the schottky electrode 9, the source electrode 6 and the drain electrode 10. However, the materials of the electrodes 6, 9 and 10 are not limited to this, and may be a metal, such as titanium (Ti), aluminum (Al) or molybdenum (Mo).

From the foregoing explanation, many modification and other embodiments of the present invention are obvious to one skilled in the art. Therefore, the foregoing explanation should be interpreted only as an example, and is provided for the purpose of teaching the best mode for carrying out the present invention to one skilled in the art. The structures and/or functional details may be substantially modified within the spirit of the present invention.

INDUSTRIAL APPLICABILITY

A semiconductor device according to the present invention can realize both high-speed switching operation and energy loss reduction and excels in resistance to current concentration based on a counter electromotive voltage generated by, for example, an inductance load of an electric apparatus, and is applicable to a high-speed inverter power source circuit of, for example, electric apparatus.

The invention claimed is:

1. A semiconductor device comprising:
   a semiconductor layer made of a first conductivity type wide band-gap semiconductor;
   a plurality of transistor cells in each of which one vertical field effect transistor is formed, the vertical field effect transistor causing a charge carrier to move in a thickness direction of said semiconductor layer; and
   a plurality of diode cells in each of which one Schottky diode is formed, the Schottky diode being formed such that a Schottky electrode forms a Schottky junction with said semiconductor layer, wherein:
   said semiconductor layer is divided into a plurality of square subregions based on virtual border lines in plan view, each of the square subregions including either one, but not both, of one of the plurality of transistor cells and one of the plurality of diode cells,
   source electrodes provided on a surface of said semiconductor layer of said transistor cells and Schottky electrodes provided on a surface of said semiconductor layer of said diode cells are electrically connected to each other, and
   a plurality of the vertical field effect transistors and a plurality of the Schottky diodes are integrated in a same chip and connected in parallel.

2. The semiconductor device according to claim 1, wherein the plurality of the subregions are arranged in a matrix manner in two directions orthogonal to each other.

3. The semiconductor device according to claim 1, wherein the field effect transistor includes:
   a second conductivity type well provided on a surface of said semiconductor layer;
   a first conductivity type region provided inside the well;
   a drift region formed in said semiconductor layer other than the well and the first conductivity type region;
   a first source/drain electrode provided so as to contact the first conductivity type region and the well;
   a gate electrode provided on the well with an insulating layer disposed between the gate electrode and the well; and
   a second source/drain electrode connected to a back surface of the drift region in an ohmic manner.

4. The semiconductor device according to claim 1, wherein at least one of said diode cells is surrounded by said transistor cells.

5. The semiconductor device according to claim 1, wherein a ratio of an area of all said transistor cells in plan view to an area of all the subregions in plan view is more than 0.5 and not more than 0.99.

6. The semiconductor device according to claim 1, wherein a ratio of an area of all said diode cells in plan view to an area of all the subregions in plan view is more than 0.01 and not more than 0.5.

7. The semiconductor device according to claim 3, wherein a surface area of the well included in each of said transistor cells in plan view is smaller than a surface area of the Schottky electrode included in each of said diode cells in plan view.

8. An electric apparatus comprising:
   an AC driving device; and
   the semiconductor device according to claim 1, forming an inverter power source circuit of said AC driving device,
   wherein the semiconductor device is incorporated as an arm module.

9. The electric apparatus according to claim 8, wherein a voltage applied to a built-in parasitic diode of the field effect transistor and the Schottky diode based on a counter electromotive voltage generated by an inductance load in said AC driving device is higher than a forward rising voltage of the Schottky diode and lower than a forward rising voltage of the built-in parasitic diode.

10. The electric apparatus according to claim 8, wherein said AC driving device is an AC motor driven by the inverter power source circuit.

* * * * *